(12) United States Patent
Kaneko

(10) Patent No.: US 7,651,917 B2
(45) Date of Patent: Jan. 26, 2010

(54) SEMICONDUCTOR DEVICE AND A METHOD OF MANUFACTURING THE SAME

(75) Inventor: Mamoru Kaneko, Osaka (JP)

(73) Assignees: Sanyo Electric Co., Ltd., Morihuchi-shi (JP); Sanyo Semiconductor Co., Ltd., Gunma (JP)

( * ) Notice: Subject to any disclaimer, the term of this patent is extended or adjusted under 35 U.S.C. 154(b) by 0 days.

(21) Appl. No.: 12/207,140

(22) Filed: Sep. 9, 2008

(65) Prior Publication Data

US 2009/0078992 A1    Mar. 26, 2009

(30) Foreign Application Priority Data

Sep. 21, 2007    (JP) ............................. 2007-245706

(51) Int. Cl.
*H01L 21/336* (2006.01)
(52) U.S. Cl. ................... 438/270; 438/197; 438/259; 438/268; 438/272; 438/274; 257/288; 257/302; 257/329; 257/330; 257/336; 257/E21.215
(58) Field of Classification Search ........... 257/299; 438/138, 159, 272, 273, 274
See application file for complete search history.

(56) References Cited

U.S. PATENT DOCUMENTS 4,571,513 A * 2/1986 Lade et al. ................ 327/389

FOREIGN PATENT DOCUMENTS

JP    2002-043574    2/2002

* cited by examiner

*Primary Examiner*—N Drew Richards
*Assistant Examiner*—Kyoung Lee
(74) *Attorney, Agent, or Firm*—Morrison & Foerster LLP

(57) ABSTRACT

In the present invention, an npn junction is formed by circularly forming a p− type impurity region and n+ type impurity regions on a same single-crystalline substrate as a MOS transistor. Multiple npn junctions are formed apart from each other in concentric circular patterns. With this configuration, steep breakdown characteristics can be obtained, which results in good constant-voltage diode characteristics. Being formed in a manufacturing process of a MOS transistor, the present protection diode contributes to process streamlining and cost reduction. By selecting the number of npn junctions according to breakdown voltage, control of the breakdown voltage can be facilitated.

14 Claims, 15 Drawing Sheets

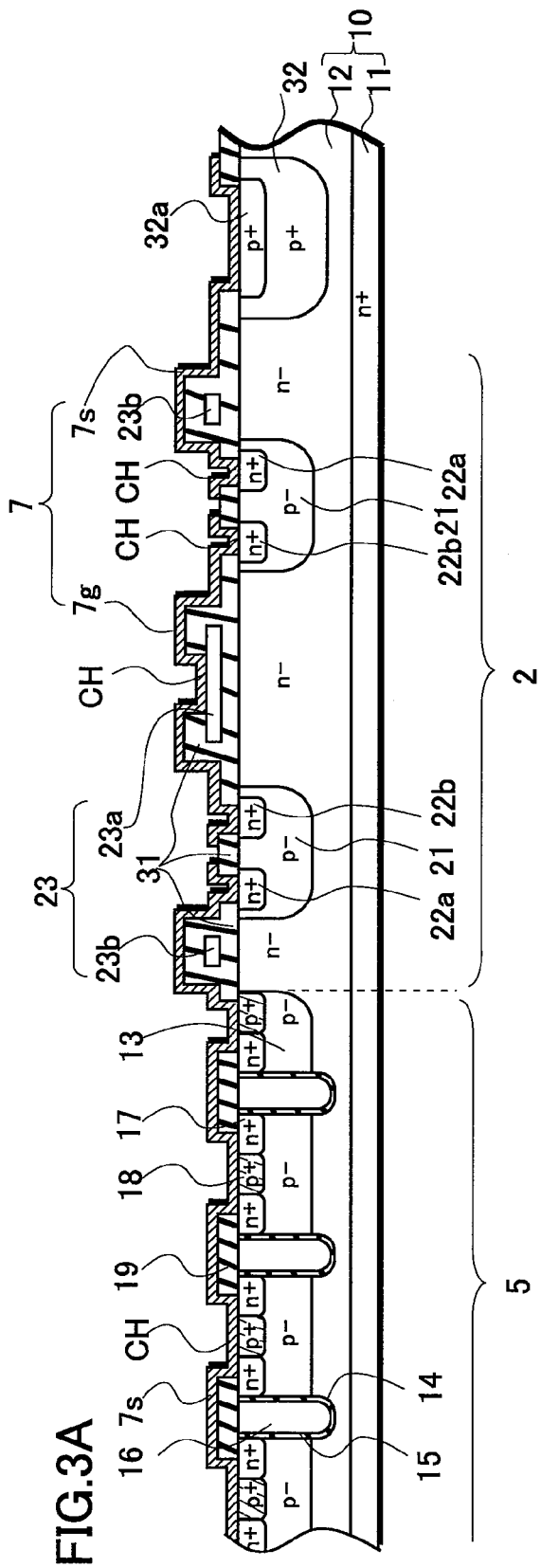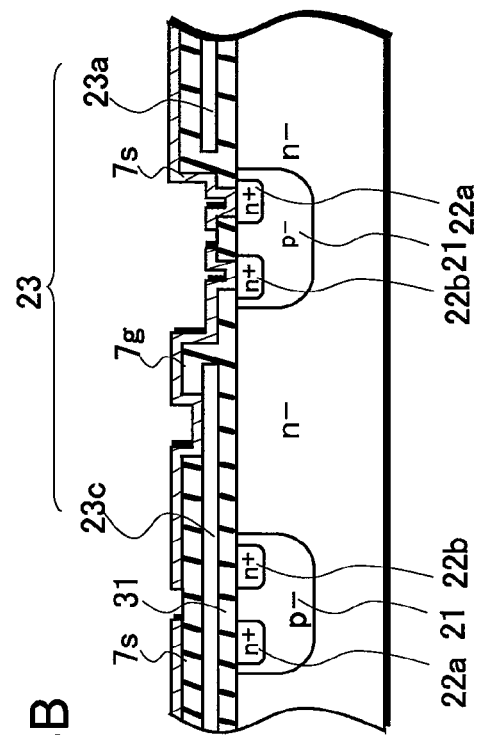

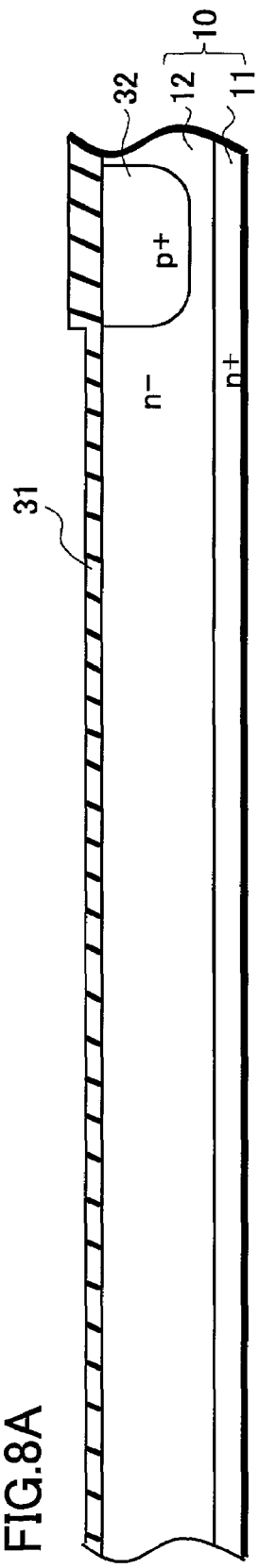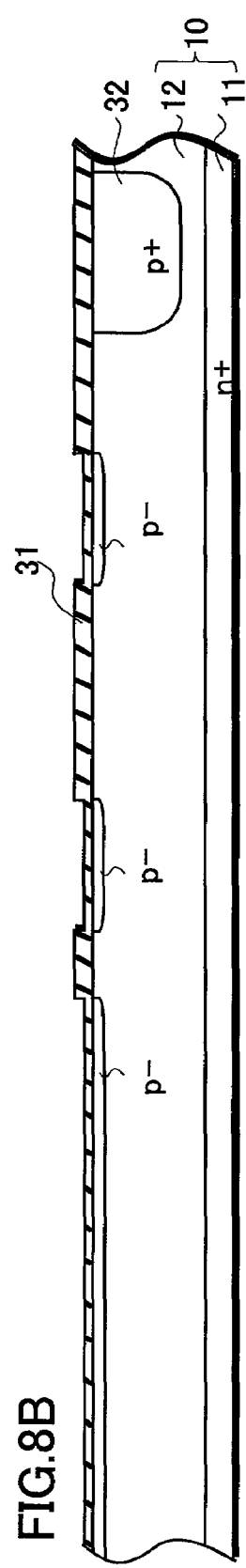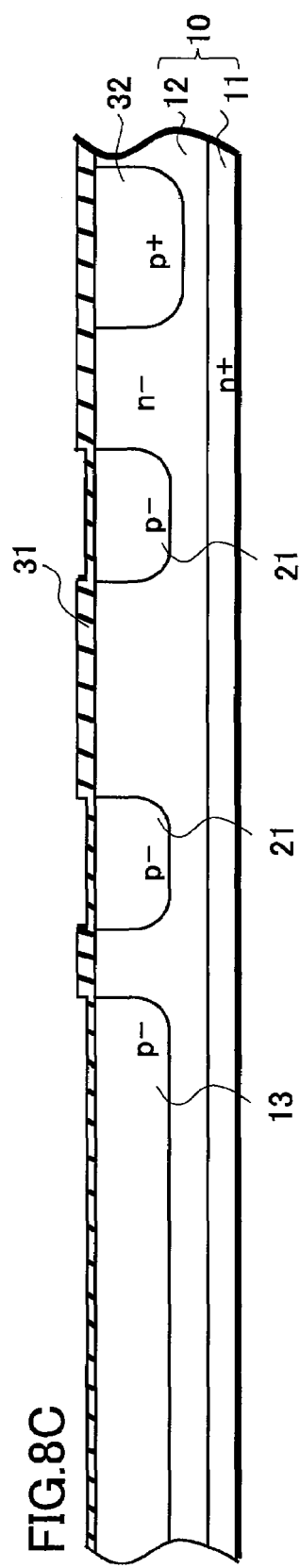

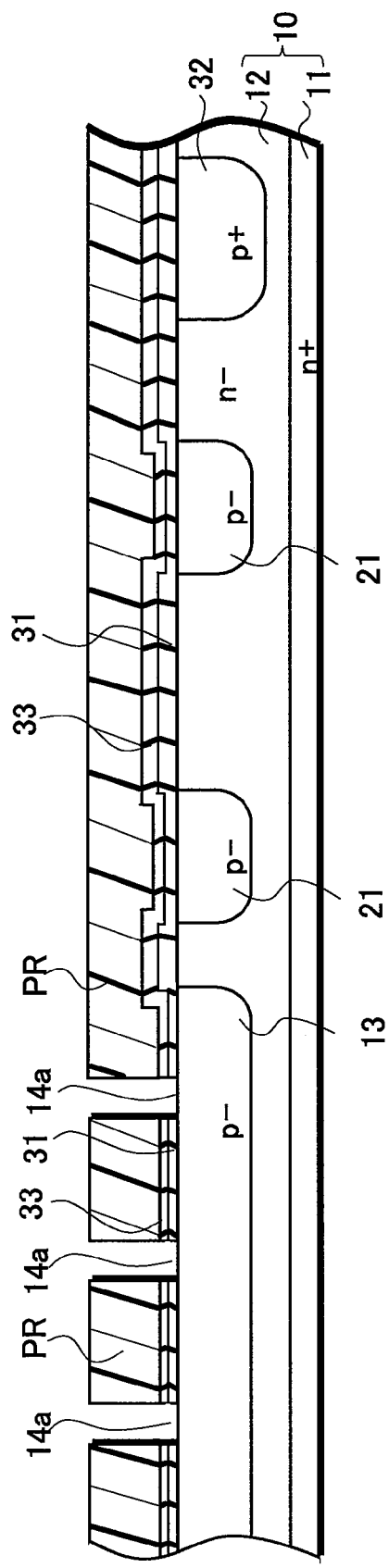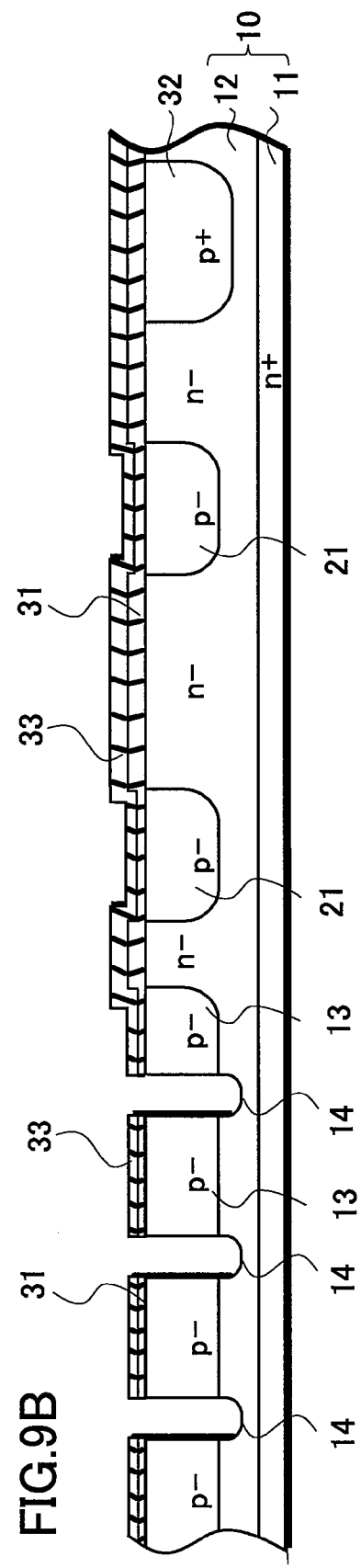

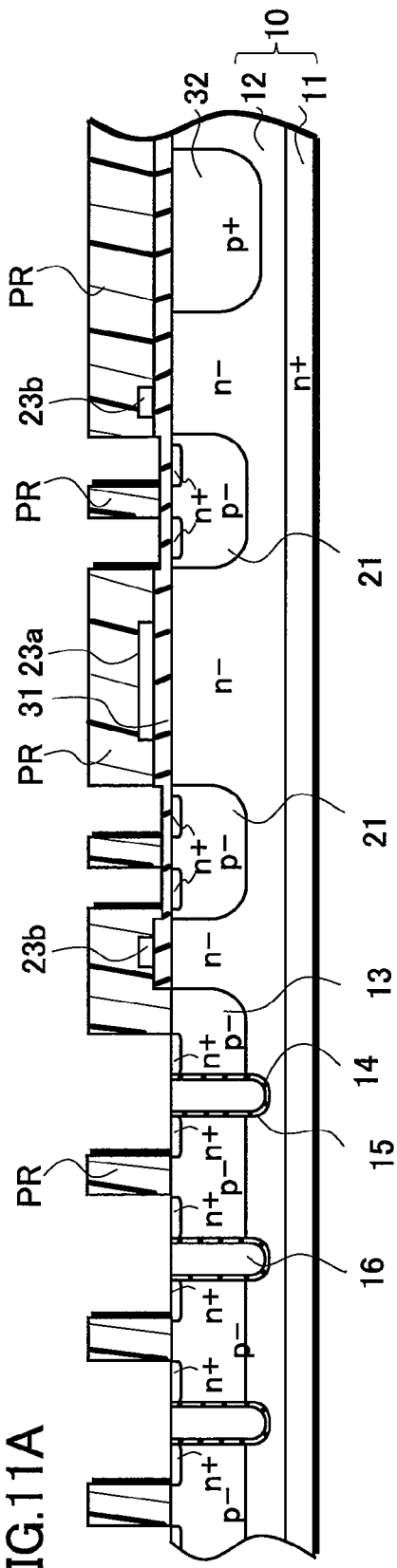
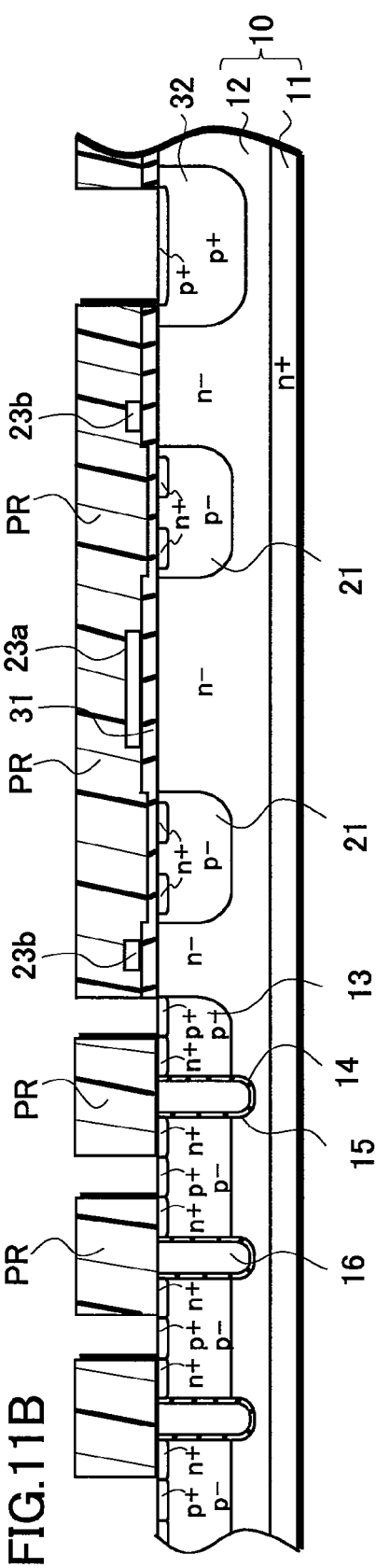
FIG.11A
FIG.11B

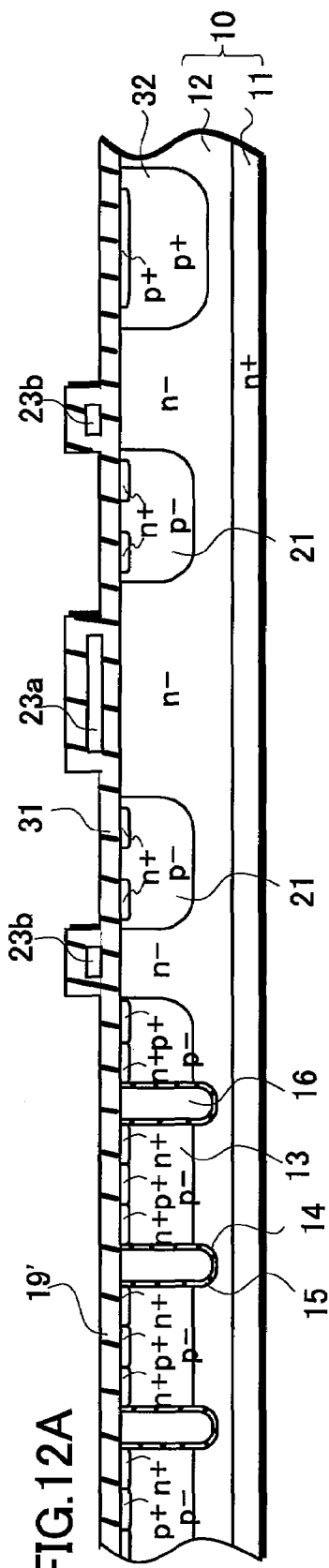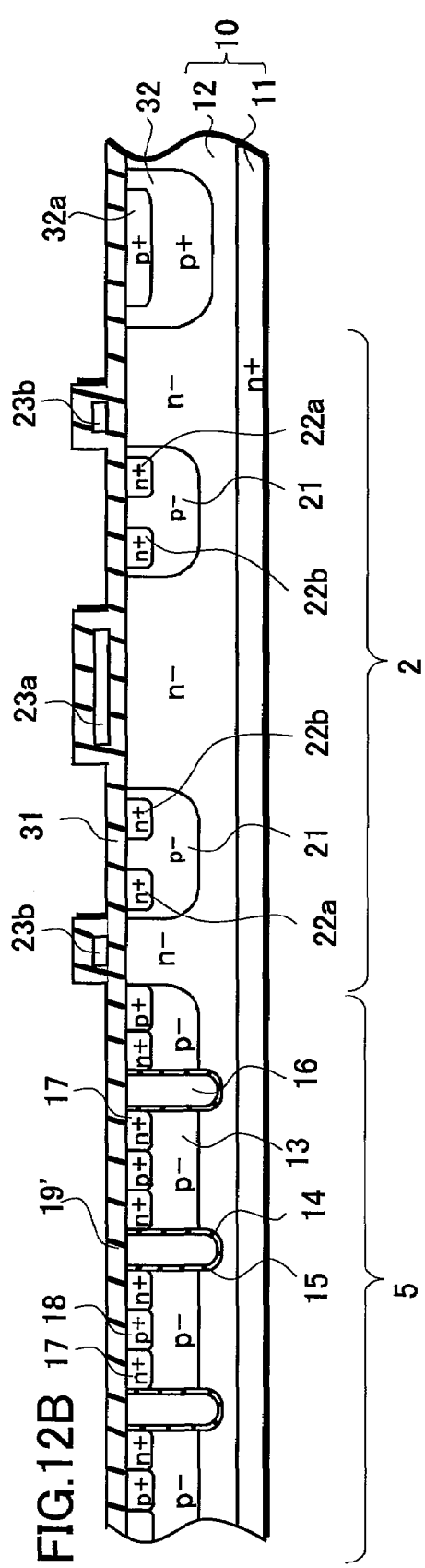

Prior Art

Prior Art

SEMICONDUCTOR DEVICE AND A METHOD OF MANUFACTURING THE SAME

This application claims priority from Japanese Patent Application Number JP 2007-245706 filed on Sep. 21, 2007, the content of which is incorporated herein by reference in its entirety.

BACKGROUND OF THE INVENTION

1. Field of the Invention

The present invention relates to a semiconductor device including a MOS transistor and a protection device integrated therein and a method of manufacturing the same. In particular, the present invention relates to a semiconductor device including a protection device with good constant-voltage characteristics and being capable of simplifying a process, and to a method of manufacturing the same.

2. Description of the Related Art

In a discrete device of a MOS-type semiconductor, a gate oxide film is the most important part, and is the most fragile part at the same time. As measures for protection of the gate oxide film, a Zener protection diode is provided to protect the gate oxide film when an excessive current, an excessive voltage, static electricity, or the like is externally applied to a gate terminal.

FIGS. 14A and 14B illustrate a conventional semiconductor device. FIG. 14A is a planar view, and FIG. 14B is a cross-sectional view taken along the line e-e in FIG. 14A.

The semiconductor device is formed by integrating, for example, a metal oxide semiconductor field-effect transistor (MOSFET) 56 and a protection diode 57 on a single chip. In an element region 55, the MOSFET 56 constituted by multiple cells is arranged. A gate electrode of the MOSFET 56 is led out of the element region 55 through a polysilicon layer, and is connected to a gate pad electrode 58.

A semiconductor base is formed by stacking an n− type semiconductor layer 42 on an n+ type silicon semiconductor substrate 41 and then forming a channel layer 43 thereon. Inside of each trench 44 which penetrates the channel layer 43, a gate oxide film 45 is formed, and a gate electrode 46 is embedded. On a surface of the channel layer 43, a body region 49 and a source region 48 are formed. On the gate electrode 46, a source electrode 47 is formed with an interlayer insulating film 50 interposed therebetween.

The protection diode 57, which is arranged below the gate pad electrode 58, is a bidirectional Zener diode formed by connecting multiple pn junction diodes between p type regions 51 and n type regions 52. One end of the protection diode 57 is connected to the source electrode 47 of the MOSFET 56, while the other end is connected to the gate pad electrode 58. A resistor 53, which is made of polysilicon, has one end connected to the gate pad electrode 58 and the other end connected to a polysilicon layer 54 which is connected to the gate electrode 46 of the MOSFET 56.

The breakdown voltage of the protection diode 57 is set slightly lower than the breakdown voltage of the gate oxide film 45 of the MOSFET 56 (breakdown voltage of the oxide film 45). With this configuration, in the case where an excessive load is applied to a gate terminal, an excessive current is bypassed to the protection diode 57 in order to prevent an excessive load from being applied to the gate electrode 46, and the gate oxide film 45 is thereby protected.

This technology is described for instance in Japanese Patent Application Publication No. 2002-43574.

The conventional protection diode 57, as shown in FIG. 14B, is a polycrystalline pn junction Zener diode formed by doping polycrystalline silicon with p type and n type impurities through solid-phase diffusion, ion implantation, or the like. However, a Zener diode having a polycrystalline pn junction does not achieve good characteristics as a constant voltage diode compared to that having a single-crystalline pn junction.

FIG. 15 shows I-V characteristics of a polycrystalline pn junction.

As shown in FIG. 15, the polycrystalline pn junction does not have steep I-V characteristics (breakdown voltage characteristics), but has gradual characteristics. Accordingly, in the case where an excessive load is externally applied thereon, an excessive current cannot fully be bypassed by use of the protection diode 57 under heavy load although being capable of dealing with a small load. Accordingly, a voltage of the breakdown voltage of the gate oxide film 45 or above is applied to the gate electrode 46, which results in destruction of the gate oxide film 45.

Meanwhile, the gradual I-V characteristics indicate that a leakage current is excessive before the breakdown voltage is reached. Accordingly, connection of the protection diode 57 formed by a polycrystalline pn junction lowers the switching characteristics of the MOSFET 56.

In other words, the film thickness of the gate oxide film 45 is limited by the performance of the protection diode 57. Therefore, the gate oxide film 45 has to be made thicker than necessary in consideration of an excessive voltage to be applied. Such an over-margin is one of the causes of lowering device performance of the MOSFET 56.

Furthermore, the above-described protection diode 57 is formed by patterning polycrystalline silicon on a surface of a substrate, and then doping predetermined regions respectively with p type impurity and n type impurity. To be more specific, a step of forming a protection diode is added in a manufacturing process of the MOSFET 56. Accordingly, the process is more complicated and the cost thereof is increased.

SUMMARY OF THE INVENTION

The invention provides a semiconductor device that includes a vertical metal oxide semiconductor transistor formed in a single-crystalline semiconductor substrate of a first general conductivity type and having a gate electrode and a source electrode, a protection element including a first impurity region of a second general conductivity type formed in the single-crystalline semiconductor substrate, a second impurity region of the first general conductivity type formed in the first impurity region and a third impurity region of the first general conductivity type formed in the first impurity region and separated away from the second impurity region. The first, second and third impurity regions are concentric. The second impurity region is connected to the gate of the transistor, and the third impurity region is disposed outside the second impurity region and connected to the source of the transistor.

The invention also provides a method of manufacturing a semiconductor device including a vertical metal oxide semiconductor transistor and a protection element for the transistor. The method includes providing a single-crystalline semiconductor substrate of a first general conductivity type, forming a impurity region of a second general conductivity type in the single-crystalline semiconductor substrate, forming two impurity regions of the first general conductivity type in the impurity region of the second general conductivity type so as to be concentric with the impurity region of the second general conductivity type, connecting one of the two impurity regions of the first general conductivity type to the gate of the transistor, and connecting another of the two impurity regions of the first general conductivity type to the source of the transistor.

BRIEF DESCRIPTION OF THE DRAWINGS

FIGS. 3A and 3B are cross-sectional views describing the protection diode of the embodiment.

FIGS. 8A, 8B, and 8C are cross-sectional views describing a method of manufacturing the semiconductor device of the embodiment.

FIGS. 9A and 9B are cross-sectional views describing the method of manufacturing the semiconductor device of the embodiment.

FIGS. 11A and 11B are cross-sectional views describing the method of manufacturing the semiconductor device of the embodiment.

FIGS. 12A and 12B are cross-sectional views describing the method of manufacturing the semiconductor device of the embodiment.

DESCRIPTION OF THE INVENTION

An embodiment of the present invention will be described by taking an n channel type MOSFET as an example in reference to FIGS. 1A and 1B, 2A and 2B, 3A and 3B, 4, 5A and 5B, 6, 7, 8A to 8C, 9A and 9B, 10A to 10C, 11A and 11B, 12A and 12B, and 13.

Figure 1A:
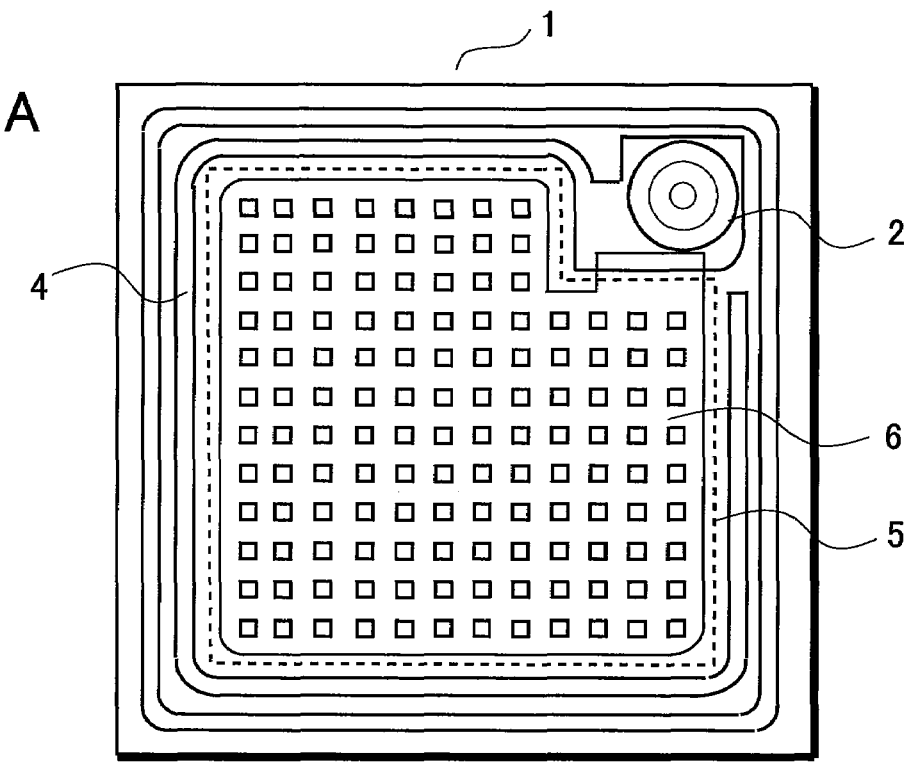
FIGS. 1A and 1B are plan views describing a semiconductor device of an embodiment of the present invention.
Figure 1B:
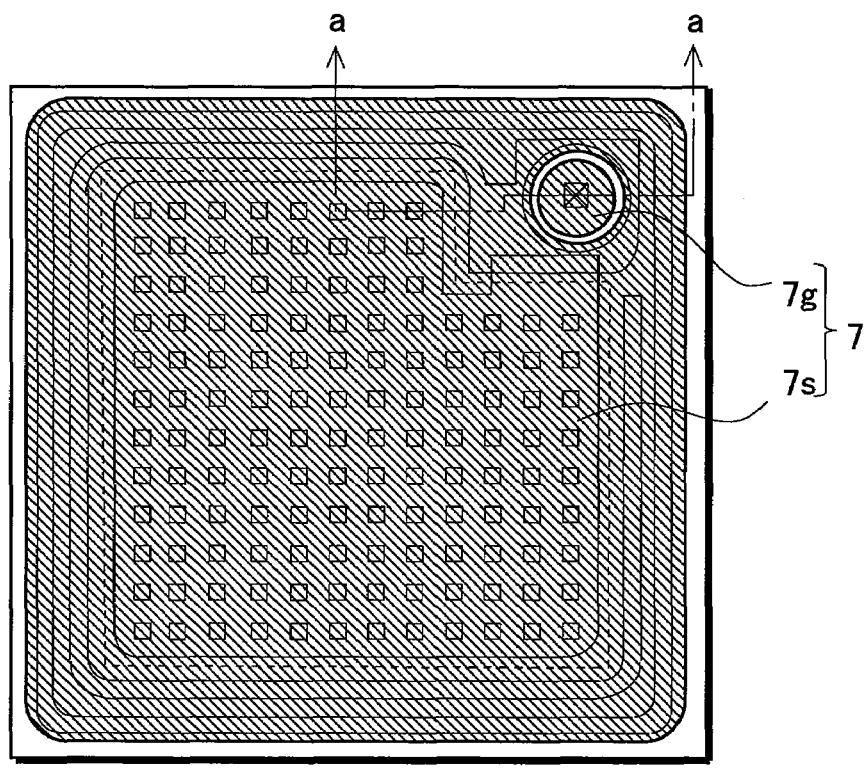

FIGS. 1A and 1B are plan views of a chip 1 of the present embodiment. FIG. 1A is a plan view in which a source electrode and a metal wiring layer constituting a gate pad electrode are omitted, and FIG. 1B is a view illustrating a pattern of the metal wiring layer.

The chip 1 is formed by integrating a MOSFET 6 and a protection diode 2 on the same single-crystalline silicon substrate. To be more specific, the MOSFET 6 consisted of a large number of cells is arranged in an element region 5 (indicated by a broken line) which occupies a most part of the chip 1. Outside of the element region 5, in a corner of the chip 1, for example, a protection diode 2 having a circular pattern is arranged.

Above the element region 5, a source electrode 7s and a gate pad electrode 7g are provided by a metal wiring layer 7. The source electrode 7s is connected to a source region of the MOSFET 6, and the gate pad electrode 7g is provided so as to overlap the protection diode 2. The protection diode 2 is formed in a circular pattern, and one end of the innermost circle is connected to the gate pad electrode 7g while the other end is connected to the source electrode 7s.

The gate pad electrode 7g is arranged around the element region 5, and is connected to individual gate electrodes of the MOSFET 6 through a gate wiring 4 constituted by a polysilicon layer. To be more specific, the protection diode 2 is connected to each of the gate and the source of the MOSFET 6 so as to protect a gate oxide film from external static electricity and an excessive voltage during operation.

Figure 2A:
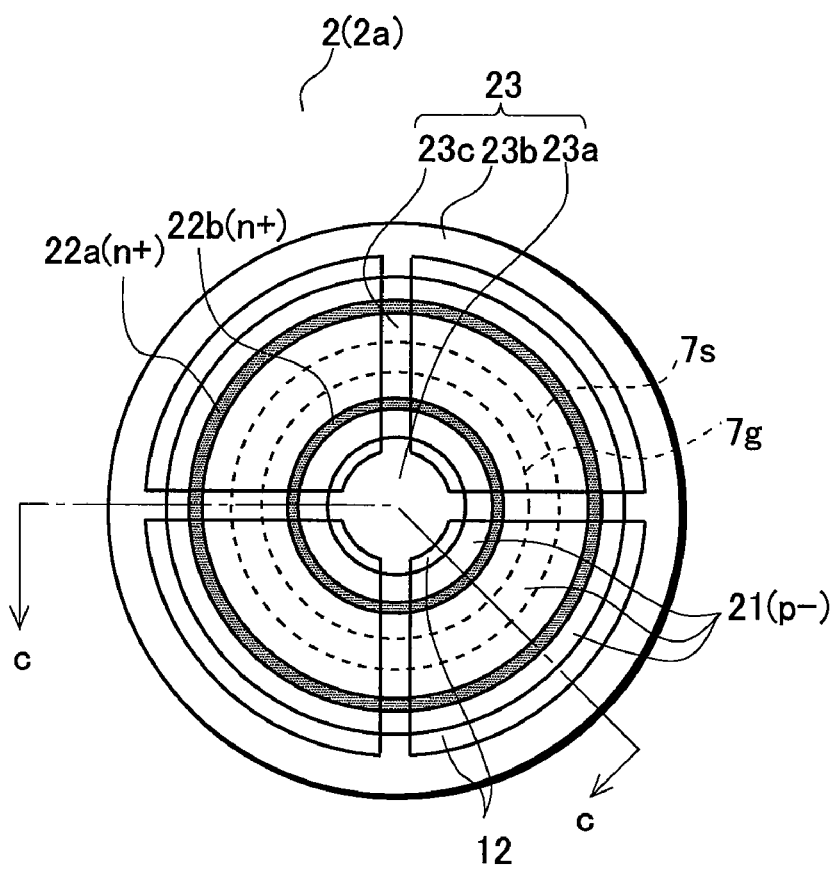
FIGS. 2A and 2B are plan views describing a protection diode of the embodiment.
Figure 2B:
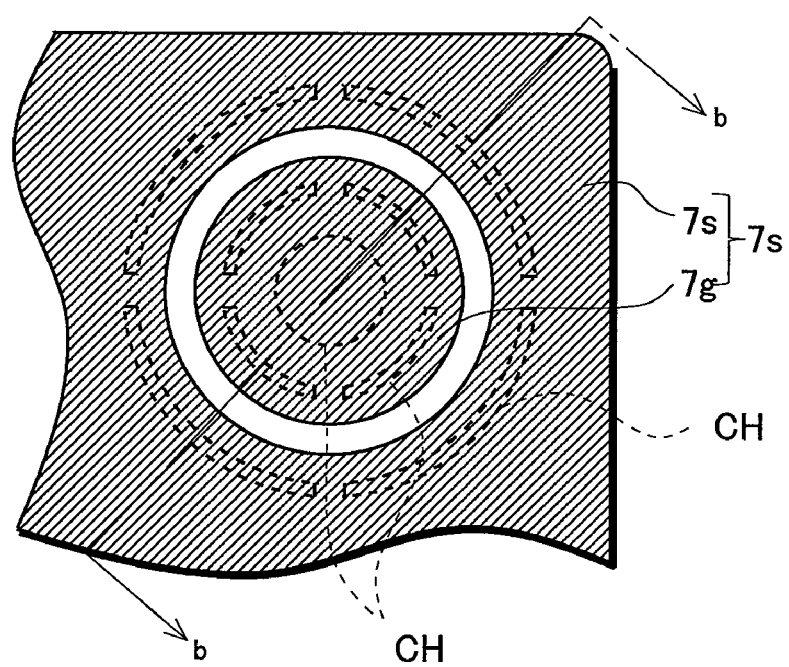

FIGS. 2A and 2B are drawings describing the protection diode 2 of the present embodiment. FIG. 2A is a plan view of the protection diode 2, and the metal wiring layer 7 is omitted but shown by a broken line in this drawing. FIG. 2B is a pattern view illustrating contact between a metal wiring layer and the protection diode 2, and a contact hole is shown by a broken line in the drawing.

As shown in FIG. 2A, the protection diode 2 includes, on an surface of a single-crystalline silicon substrate: a p− type impurity region 21; a first n+ type impurity region 22a; and a second n+ type impurity region 22b, all having an impurity being diffused in a circular pattern therein. All of these regions are concentric circles. The first n+ type impurity region 22a and the second n+ type impurity region 22b have the same impurity concentration, and are arranged on the surface of the p− type impurity region 21 apart from each other by a predetermined distance. Here, notations 22a for the first n+ type impurity region and 22b for the second n+ type impurity region are provided for distinguishing them from each other in description, but they have the completely identical configuration. It is noted that conductivity types such as n+, n and n− belong in one general conductivity type, and conductivity types such as p+, p and p− belong in another general conductivity type.

In this embodiment, the impurity regions 21, 22a and 22b are circular. However, they maybe of a polygonal shape, such as a square, or any other shape, as long as they are approximately concentric. In other words, the protection diode 2 shown in FIG. 1A does not have be of a circular shape.

In the drawing, one p− type impurity region 21 is shown. This one p− type impurity region 21 as well as the first and the second n+ type impurity regions 22a and 22b formed on the surface of the p− type impurity region 21, constitute a minimum unit (unit protection diode 2a) of the protection diode 2. Accordingly, the case where one unit protection diode 2a constitutes the protection diode 2 will be described here. Note that, in the present embodiment, the protection diode 2 may be constituted by providing unit protection diodes 2a in a multiple concentric circular pattern according to the breakdown voltage, and this will be described later.

On the surface of the silicon substrate, a poly-silicon layer 23a is concentrically arranged having its center at the center of the protection diode 2. A circular polysilicon layer 23b is arranged so as to surround the outer circumference of the protection diode 2. The poly-silicon layer 23a and the circular poly-silicon layer 23b are connected to each other by a connecting part 23c, and all of them are patterned by the same polysilicon layer 23.

The surface of the protection diode 2 is covered by an insulating film (not shown in the drawing). The insulating film also covers the polysilicon layer, contact holes CH are formed in patterns indicated by the broken lines in FIG. 2B, and a metal wiring layer 7 is arranged thereon. The contact holes CH are formed corresponding to the first n+ type impurity region 22a and the second n+ impurity region 22b so as to allow them to be exposed.

By the metal wiring layer 7, a gate pad electrode 7g on the protection diode 2 and a source electrode 7s on the element region 5 are formed.

The gate pad electrode 7g is in contact with the polysilicon layer 23a located at the center of the protection diode 2 and the second n+ type impurity region 22b which is the innermost circle, as shown by the broken line in FIG. 2A. The polysilicon layer 23a is connected to a gate electrode of the MOSFET 6.

The source electrode 7s is patterned as shown by the broken line in FIG. 2A so as to keep a predetermined distance from the gate pad electrode 7g and surround the periphery thereof. The source electrode 7s is in contact with the first n+ type impurity region 22a which located at the outer circumference of the protection diode 2 and a source region of the MOSFET 6.

FIGS. 3A and 3B illustrate a cross section of the vicinity of the protection diode 2. FIG. 3A is a cross-sectional view of FIG. 1B taken along the line a-a. FIG. 3A also illustrates the protection diode 2 illustrated in FIG. 2B taken along the line b-b. FIG. 3B is a cross-sectional view of the protection diode 2 illustrated in FIG. 2A taken along the line c-c.

A single-crystalline silicone substrate 10 is formed by providing an n− type semiconductor layer (for example, an epitaxial layer) 12 on an n+ type silicon semiconductor substrate 11, and serves as a drain region of the MOSFET 6.

In the element region 5, a channel layer 13 is formed by doping a p type impurity on the surface of the n− type semiconductor layer 12, and a large number of cells of the MOSFET 6 are arranged. In the present embodiment, the element region 5 refers to a region having the MOSFET 6 arranged therein within the channel layer 13 (refer to the broken line in FIG. 1A).

A trench 14 is formed by etching the single-crystalline silicone substrate 10 until it reaches the n− type semiconductor layer 12 penetrating the channel layer 13. The inner wall of the trench 14 is coated with a gate oxide film 15, and a gate electrode 16 is embedded inside of the trench 14. The gate electrode 16 is constituted by polysilicon including an impurity introduced therein.

On the surface of the channel layer 13 adjacent to the trench 14, an n+ type source region 17 is formed, while a p+ type body region 18 is formed on the surface of the channel layer 13 located between two neighboring source regions 17. When a gate voltage is applied, a channel region (not shown in the drawing) is formed in the channel layer 13 in a perpendicular direction of the single-crystalline silicon substrate 10 along the trench 14 from the source region 17. In other words, the MOSFET 6 of the present embodiment is a vertical transistor in which a current path between the source and the drain is formed in a perpendicular direction of the substrate.

The surface of the gate electrode 16 is covered by an interlayer insulating film 19, and the source electrode 7s provided thereon is connected to the source region 17 and the body region 18 through the contact hole CH. Meanwhile, at an end of the chip 1, a guard ring 32 is provided.

The protection diode 2 includes, on an surface of the single-crystalline silicone substrate 10 (n− type semiconductor layer 12): a p− type impurity region 21 in which an impurity is diffused in a circular pattern; and a first n+ type impurity region 22a and a second n+ type impurity region 22b both formed in the p− type impurity region 21 and having an impurity being diffused in a circular pattern concentric with the p− type impurity region 21.

The p− type impurity region 21 has an impurity concentration (dose amount of approximately $3.0\times10^{13}$ cm$^{-2}$) equivalent to that of the channel layer 13 of the MOSFET 6, and the first and second n+ type impurity regions 22a and 22b have an impurity concentration (dose amount in an approximate range from $5.0\times10^{15}$ cm$^{-2}$ to $6.0\times10^{15}$ cm$^{-2}$) equivalent to that of the source region 17 of the MOSFET 6.

At the center of the protection diode 2, a polysilicon layer 23a is arranged interposing an insulating film 31 formed on the surface of the single-crystalline silicon substrate 10. The polysilicon layer 23a is patterned onto a forming region of the protection diode 2 during the formation of the gate electrode 16 of the MOSFET 6, and connected to the gate electrode 16.

Furthermore, a circular polysilicon layer 23b is arranged outside of the protection diode 2 adjacent thereto. The polysilicon layer 23a located at the center and the circular polysilicon layer 23b are connected with each other by a connecting part 23c as shown in FIGS. 2A and 3B. The circular polysilicon layer 23b and the connecting part 23c are patterned at the same time as the polysilicon layer 23a, and arranged on the insulating film 31. By having the circular polysilicon layer 23b, formation of an inversion layer on the surface of the single-crystalline silicon substrate 10 can be prevented.

Note that the insulating film 31 arranged below the polysilicon layer 23 and the insulating film 31 covering the periphery of the polysilicon layer 23 are formed during the manufacturing process of the MOSFET 6, such as in formation of the channel layer 13, the gate oxide film 15, and the interlayer insulating film 19 of the MOSFET 6, and such films are collectively referred to as the insulating film 31.

A gate pad electrode 7g is provided so as to cover the center of the protection diode 2 and the second n+ type impurity region 22b located at the innermost circle and to come in contact with them. Furthermore, outside of the protection diode 2, a source electrode 7s is provided so as to cover the element region 5 and the first n+ type impurity region 22a and to come in contact with them. These electrodes are arranged to keep a predetermined distance from each other on the p− type impurity region 21.

As described above, in the present embodiment, an npn junction is formed on the single-crystalline silicon substrate 10, and, for example, the second n+ type impurity region 22b is connected to the gate electrode 16 (gate pad electrode 7g) of the MOSFET 6, and the first n+ type impurity region 22a is connected to the source electrode 7s of the MOSFET 6.

With this configuration, a bidirectional Zener diode of a single-crystalline npn junction is connected between the gate and the source of the MOSFET 6. In other words, the fragile gate oxide film 15 can be protected from excessive load in both positive and negative directions.

Figure 4:
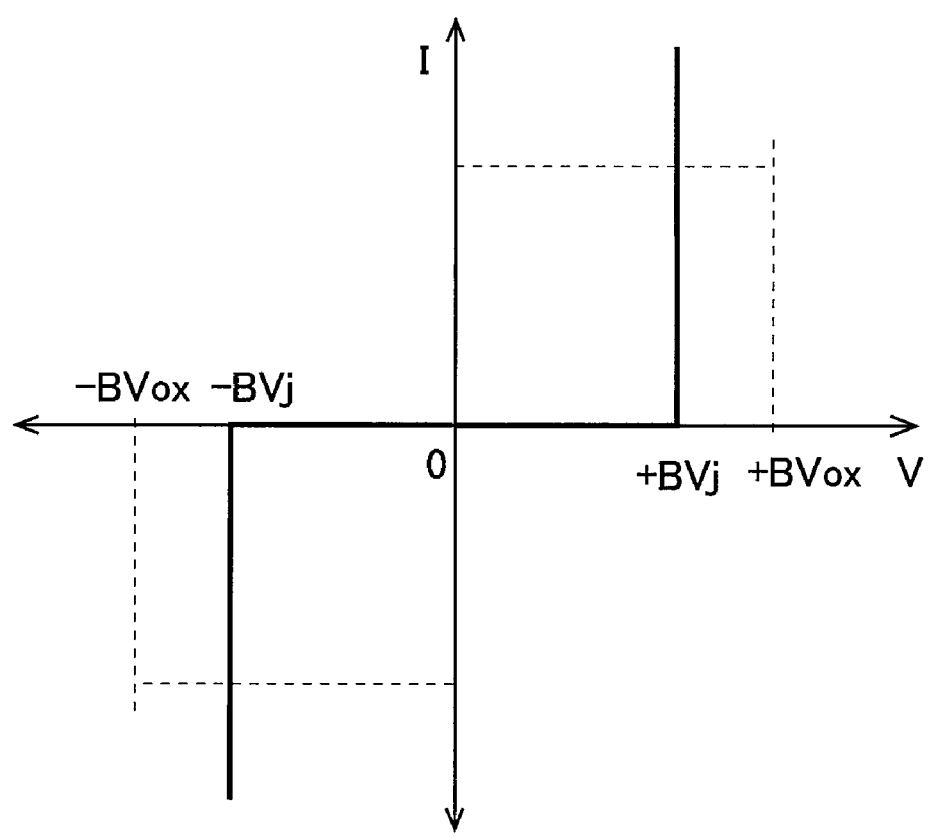
FIG. 4 is a characteristic view describing the protection diode of the embodiment.

FIG. 4 shows breakdown characteristics of a single-crystalline npn junction.

As shown in the drawing, corresponding to a breakdown voltage VCEO characteristics between an emitter and a collector of a bipolar transistor, a single-crystalline npn junction (or pnp junction) has the steepest breakdown characteristics (hard breakdown). Accordingly, ideal breakdown characteristics as a constant voltage diode can be achieved.

Due to such steep breakdown, an excessive current can be sufficiently bypassed by use of the protection diode 2 even in the case where an external electric load is large. Therefore, the gate oxide film can be surely protected.

Meanwhile, there is extremely little leakage current before the breakdown voltage is reached. Accordingly, the switching characteristics of the MOSFET 6 are not degraded even if the protection diode 2 is connected thereto.

There is no need to make the gate oxide film thicker than necessary in preparation for excessive electric load to be applied and to secure an over-margin. Accordingly, the device performance is not deteriorated.

As will be further described later, since the protection diode 2 can be formed by use of the manufacturing process of the MOSFET 6, no special step of manufacturing a protection diode needs to be added as in a conventional way. Therefore, complication of the process and cost increase can be avoided.

Next, by referring to FIGS. 5A, 5B, 6, and 7, the case where the protection diode 2 is formed in a multi-circular pattern (multi-rings) will be described. In other words, the case where unit protection diodes 2a shown in FIGS. 2A and 2B are multiply arranged and connected in series with each other to form the protection diode 2 will be described.

Figure 5A:
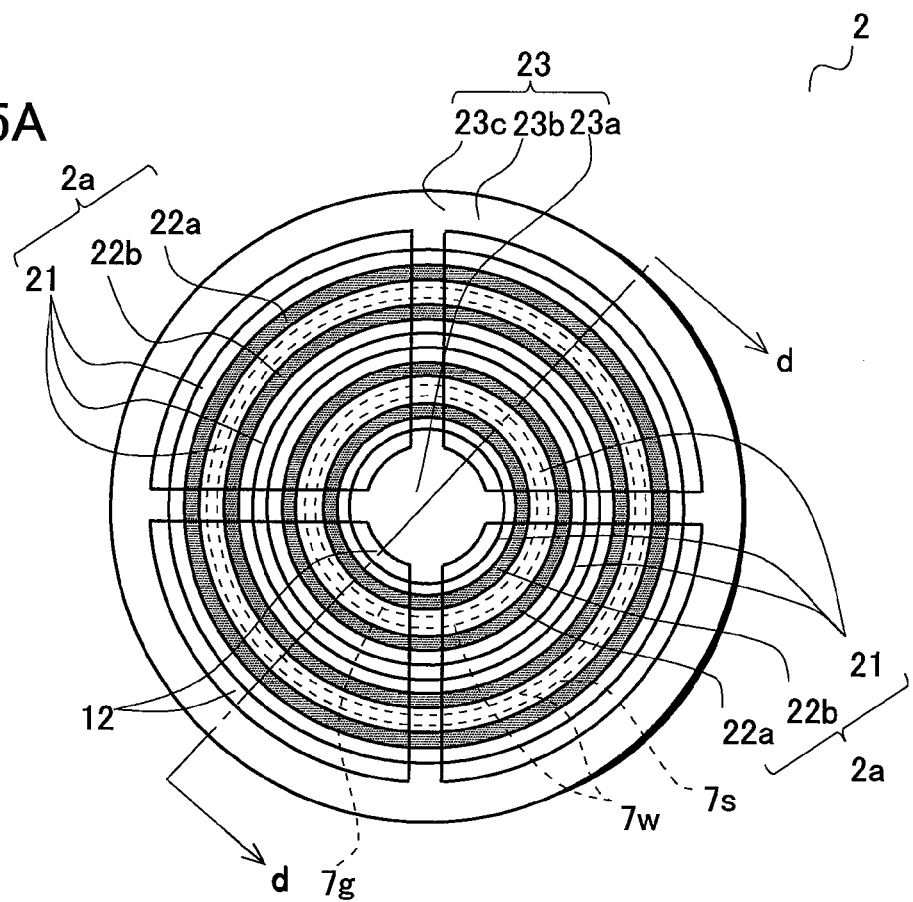
FIGS. 5A and 5B are plan views describing the protection diode of the embodiment.
Figure 5B:
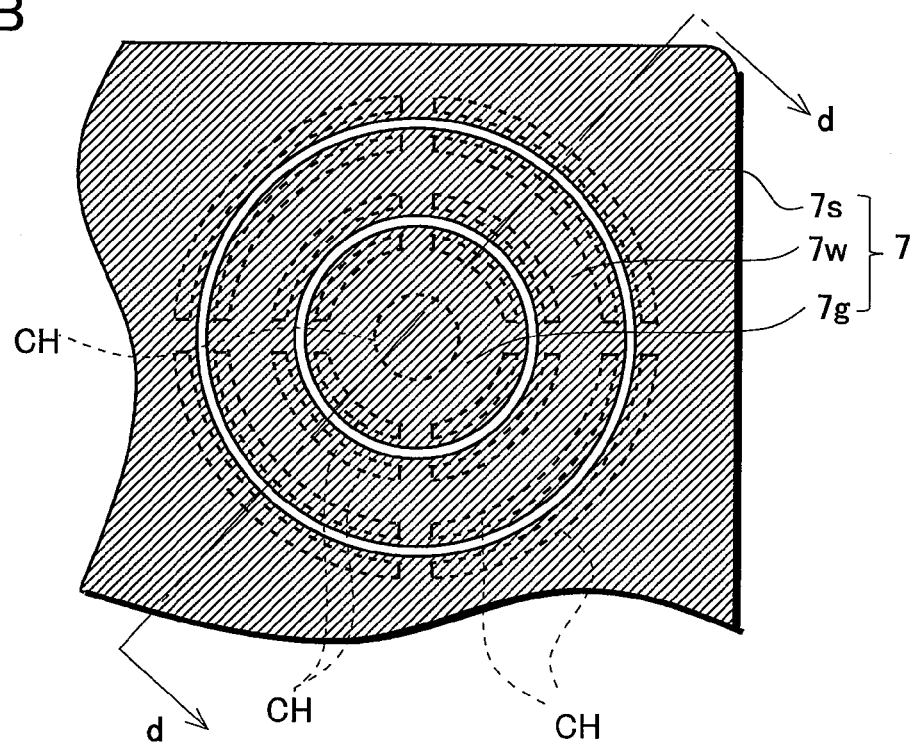
Figure 6:
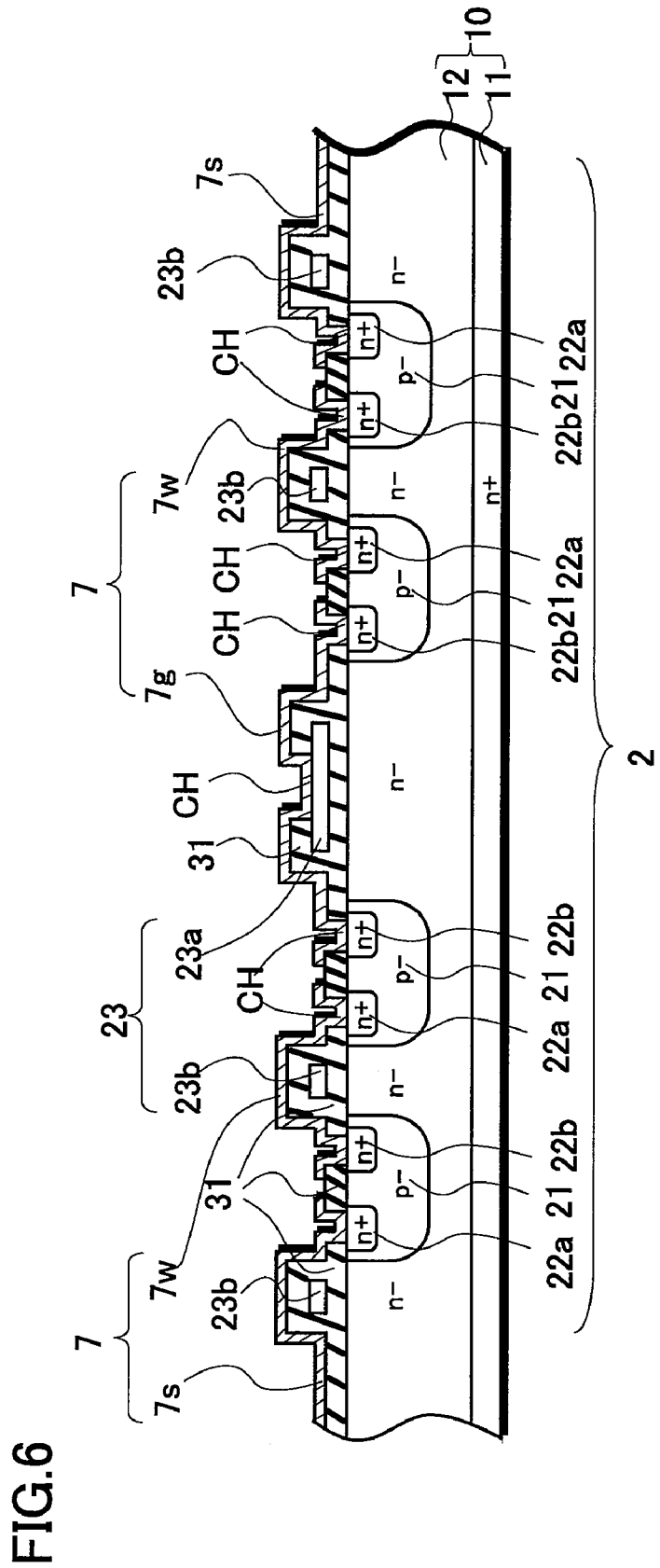
FIG. 6 is a cross-sectional view describing the protection diode of the embodiment.

FIGS. 5A, 5B and 6 illustrate the case where the protection diode 2 is formed in a double circle pattern. FIG. 5A is a plan view of the protection diode 2, FIG. 5B is a plan view of the metal wiring layer 7, and FIG. 6 is a cross-sectional view of FIGS. 5A and 5B taken along the line d-d.

Figure 7:
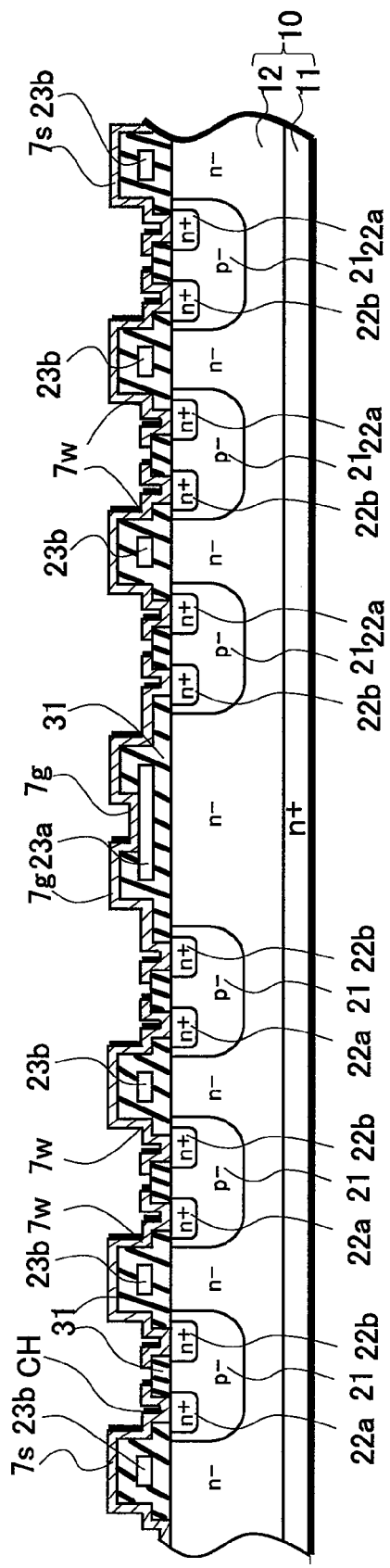
FIG. 7 is a cross-sectional view describing the protection diode of the embodiment.

In the meantime, FIG. 7 illustrates the case where the protection diode 2 is formed in a triple circle pattern, and shows only a cross-sectional view of FIGS. 5A and 5B taken along the line d-d.

As shown in FIG. 5A, in the case of double circle pattern, two unit protection diodes 2a which are concentric circles are formed keeping a predetermined distance between each other on the surface of the single-crystalline silicon substrate 10. In other words, in addition to one p– type impurity region 21, another concentric p– type impurity region 21 is arranged keeping a predetermined distance from the one p– type impurity region 21. The p– type impurity regions 21 each include a first n+ type impurity region 22a and a second n+ type impurity region 22b, and these are also all concentric circles.

Moreover, in the case of a double circle pattern as shown in FIGS. 5A, 5B and 6, the metal wiring layer 7 on the protection diode 2 is patterned onto the gate pad electrode 7g, the source wiring 7w, and the source electrode 7s. The gate pad electrode 7g covers the polysilicon layer 23a of the protection diode 2 and the second n+ type impurity region 22b located at the innermost circle and is in contact with them. Meanwhile, the source wiring 7w covers the first n+ type impurity region 22a of one unit protection diode 2a and the second n+ type impurity regions 22b of other unit protection diodes located around the one unit protection diode 2a, and is in contact with these regions.

Then, the source electrode 7s covering the element region 5 even covers the first n+ type impurity region 22a of other unit protection diode 2a, and is in contact with this first n+ type impurity region 22a and the source region 17 of the MOSFET 6.

By having such a configuration, two unit protection diodes 2a are connected in series with each other to form the protection diode 2 in a double circle pattern. In this configuration, the second n+ type impurity region 22b located at the innermost circle is connected to a gate electrode of the MOSFET 6, the first n+ type impurity region 22a located at the outermost circle is connected to a source electrode of the MOSFET 6, and the protection diode 2 is thus connected to each of the gate and the source of the MOSFET 6.

In the case of a triple circle pattern as shown in FIG. 7, three unit protection diodes 2a are arranged in a concentric pattern, and connected in series with each other to form the protection diode 2. In this case, there are two source wirings 7w. Each source wiring 7w connects the first n+ type impurity region 22a and the second n+ impurity region 22b of two adjacent unit protection diodes 2a. Then, the second n+ type impurity region 22b located at the innermost circle is connected to the gate electrode of the MOSFET 6, and the first n+ type impurity region 22a located at the outermost circle is connected to the source electrode of the MOSFET 6. As a result, the protection diode 2 is connected to each of the gate and the source of the MOSFET 6.

On the surface of the single-crystalline silicon substrate 10 located between two adjacent unit protection diodes 2a, the circular polysilicon layer 23b is arranged with the insulating film 31 interposed in between. The circular polysilicon layer 23b can prevent formation of an inversion layer on the surface of the single-crystalline silicon substrate 10. To be more specific, the same voltage as that for the gate electrode 16 is applied to the circular polysilicon layer 23b. Accordingly, when a positive voltage is applied to the gate electrode 16, electrons are attracted to the surface of the drain region (n– type semiconductor layer) 12. Therefore, connection between adjacent p– type impurity regions 21 can be prevented.

The number of unit protection diodes 2a connected determines the breakdown voltage of the protection diode 2. In other words, the breakdown voltage can be controlled by constituting the protection diode 2 in a multi-circular pattern (for example, triple circle pattern) by the use of multiple unit protection diodes 2a in advance, and then selecting and connecting any number of the unit protection diodes 2a using the source wiring 7w.

To be more specific, even in the case where a breakdown voltage required to the device varies, control is easy by use of the pattern of the contact hole CH and the pattern of the source wirings 7w. Accordingly, the breakdown voltage of the protection diode 2 can be set much, more freely.

Next, the method of manufacturing a semiconductor device will be described by taking the case, as an example, where an n channel type MOSFET and a single-ring protection diode 2 (unit protection diode 2a) are integrated onto the same chip (refer to FIGS. 2A, 2B, 3A and 3B) in reference to FIGS. 8A, 8B, 8C, 9A, 9B, 10A, 10B, 10C, 11A, 11B, 12A, 12B and 13.

First step (FIGS. 8A, 8B, and 8C): A single-crystalline silicon substrate 10 in which an n– type semiconductor layer 12 is layered onto an n+ type silicon semiconductor substrate 11 is prepared. The single-crystalline silicon substrate 10 serves as a drain region. Once an oxide film 31 is formed on the surface of the substrate, provided is a resist mask which allows a region in which a guard ring is to be formed to be exposed, and the oxide film is etched. On the entire surface of the substrate, boron (B), for example, is introduced by ion implantation. As the implantation conditions, a dose amount is set in a range from $2.0 \times 10^{15}$ to $5.0 \times 10^{15}$ cm$^{-2}$ and an implantation energy is set in a range from 50 to 100 KeV. Thereafter, the implanted impurity is diffused by thermal treatment (1000° C.), and then a guard ring 32 is formed (FIG. 8A).

After removing the oxide film on the entire surface by wet etching, a new oxide film 31 is deposited thereon. After a resist mask is provided so that a region in which a channel layer is to be formed and a region in which a p– type impurity region of the protection diode 2 to be formed are exposed, the oxide film 31 is selectively removed. Then, boron, for example, is introduced thereon by ion implantation. As the implantation conditions, a dose amount is set at approximately $3.0 \times 10^{13}$ cm$^{-2}$, and an implantation energy is set at 50 KeV (FIG. 8B).

Thereafter, the implanted impurity is diffused by performing annealing at 1100° C. under nitrogen atmosphere. With this operation, a p– type channel layer 13 is formed in the element region 5. At the same time, a p– type impurity region 21 of the protection diode 2 is formed. The p– type impurity region 21 is formed in circular by the mask shown in FIG. 8B outside of the region in which the element region 5 is formed, for example, on a corner of the chip. Moreover, p– type impurity region 21 is formed in the same step of forming the channel layer 13 in the same conditions, and has the same impurity concentration (FIG. 8C).

Second step (FIGS. 9A and 9B): A CVD oxide film 33 of non– doped silicate glass (NSG) is formed on the entire surface by a CVD method. Thereafter, a resist mask PR is provided so that an opening portion of a trench can be exposed, and the CVD oxide film 33 and the oxide film 31 are selectively removed by dry etching so as to form a trench opening portion 14a in which the channel layer 13 is exposed (FIG. 9A).

Thereafter, the single-crystalline silicon substrate 10 exposing in the trench opening portion 14a is subjected to dry etching with CF based and HBr based gases using the CVD oxide film 33 and the oxide film 31 as masks. Then, a trench 14 penetrating the channel layer 13 and reaching the n– type semiconductor layer 12 is formed (FIG. 9B).

Third step (FIGS. 10A, 10B and 10C): A dummy oxide film (not shown in the drawing) is formed on the inner wall of the trench 14 and the surface of the channel layer 13 by dummy oxidation, and then the dummy oxide film and the CVD oxide film 33 are removed by etching. With this operation, etching damage is eliminated in dry etching. In addition, since the trench opening portion 14a is rounded, electric field concentration can be reduced in this part.

Figure 10A:
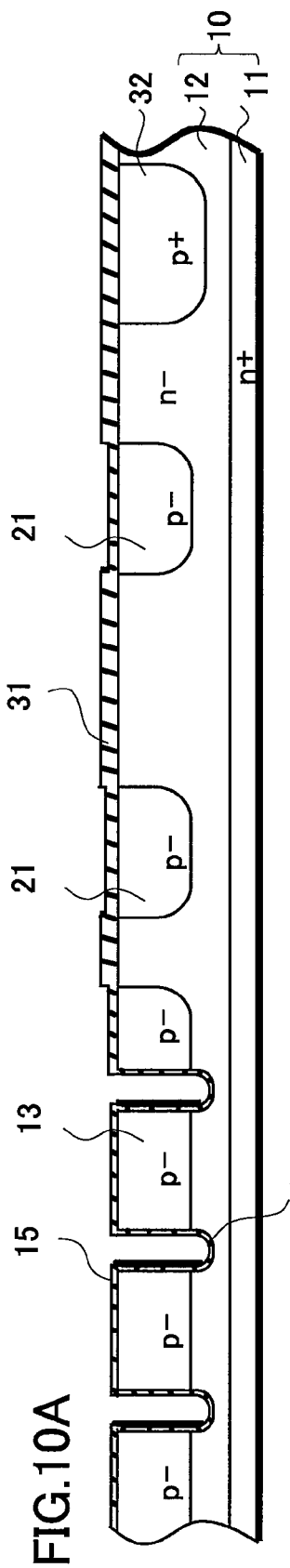
FIGS. 10A, 10B, and 10C are cross-sectional views describing the method of manufacturing the semiconductor device of the embodiment.

Furthermore, a gate oxide film 15 covering the inner wall of the trench 14 is formed by oxidizing the entire surface thereof so as to have a thickness of, for example, in an approximate range from 300 Å to 700 Å, in accordance with the driving voltage. Here, the surface of an oxide film 31 is also oxidized outside of the channel layer 13, and the gate oxide film 15 is fused with the oxide film 31 (FIG. 10A).

Figure 10B:
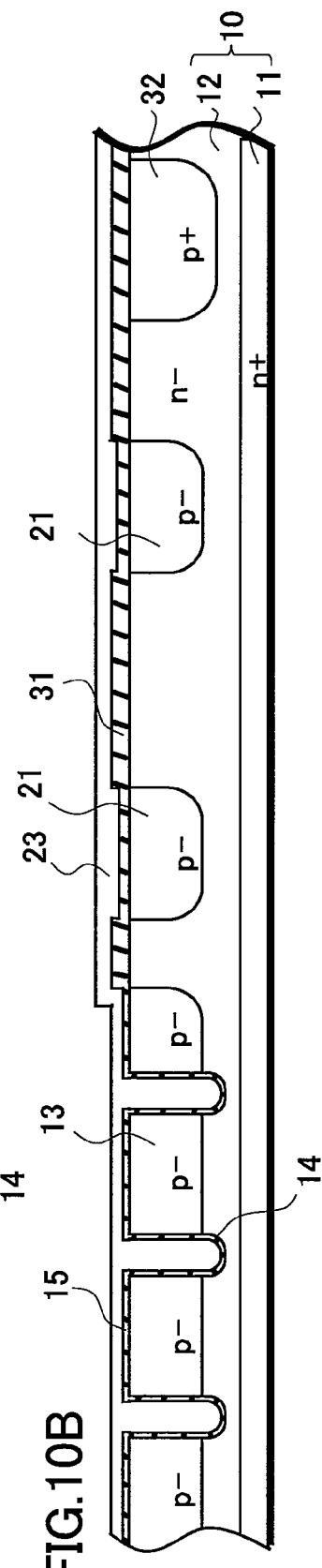

A polysilicon layer 23 having a film thickness of approximately 8000 Å is deposited on the entire surface by an LP- CVD method. The polysilicon layer 23 may be a layer formed by depositing polysilicon containing an impurity, or may be a layer formed by depositing non-doped polysilicon and then introducing an impurity thereto. The polysilicon layer 23 is embedded inside of the trench 14, and provided so as to cover an element region and the substrate surface in a region in which the protection diode 2 is formed (FIG. 10B).

Figure 10C:
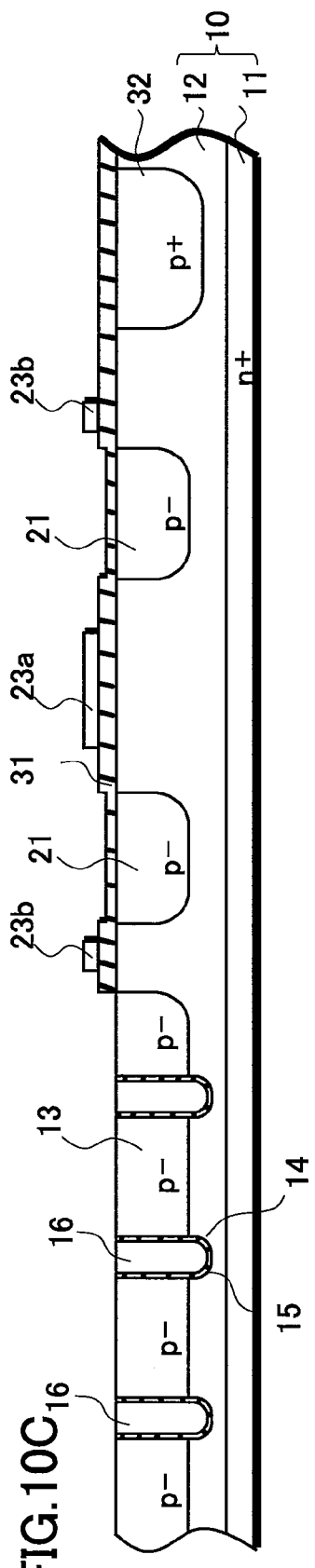
Figure 13:
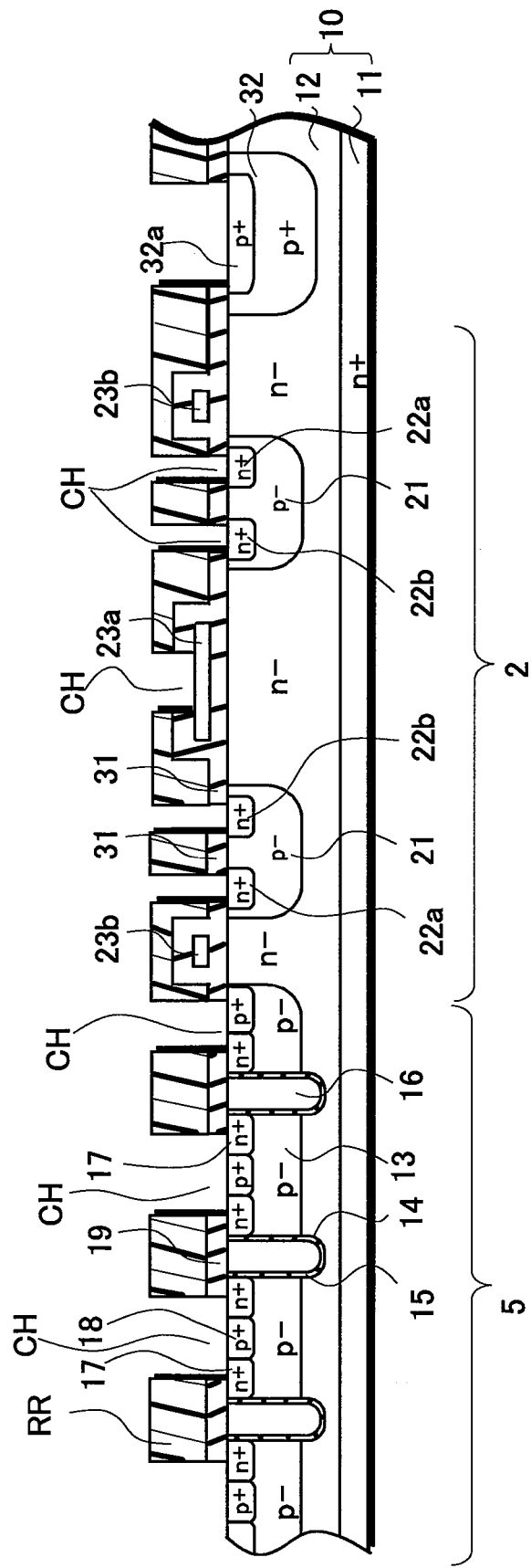
FIG. 13 is a cross-sectional view describing the method of manufacturing the semiconductor device of the embodiment.
Figure 14A:
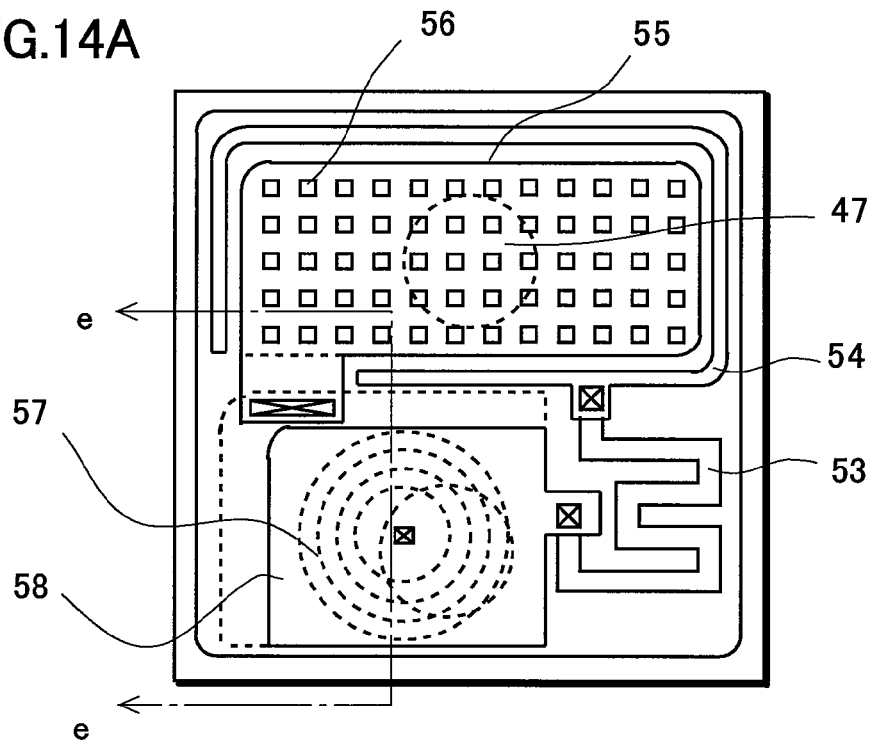
FIG. 14A is a plan view and FIG. 14B is a cross-sectional view, both describing a conventional semiconductor device.
Figure 14B:
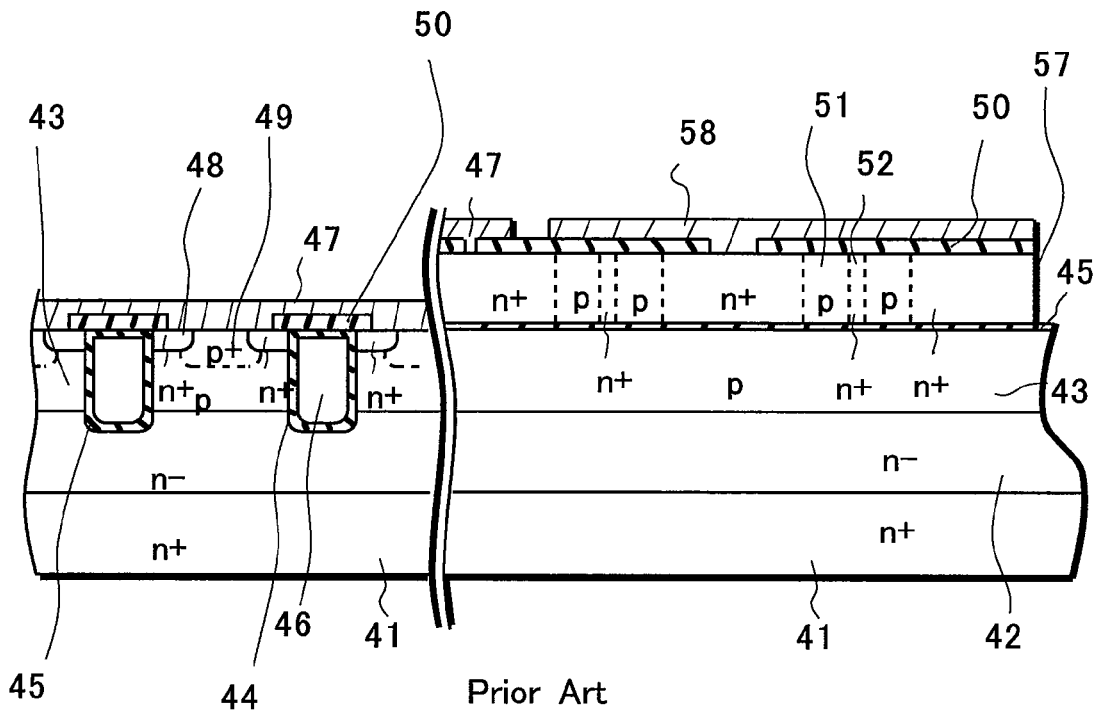
Figure 15:
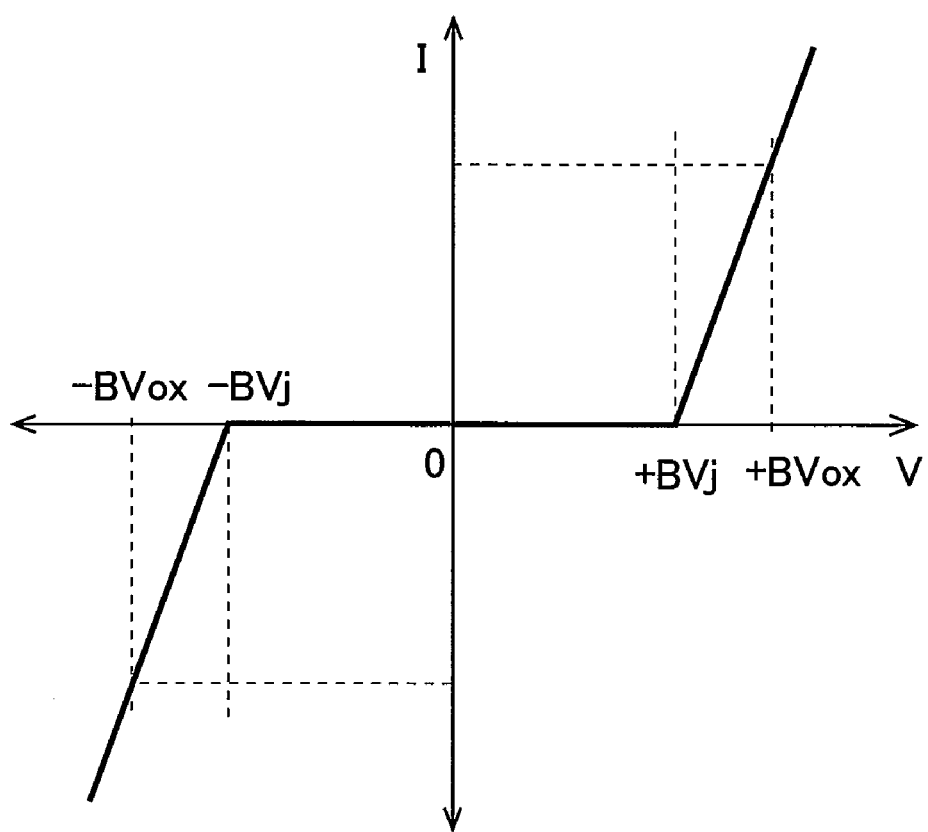
FIG. 15 is a characteristic view describing a conventional protection diode.

A resist mask is provided so as to allow the entire surface of the element region and a predetermined pattern of the region in which the protection diode is formed to be exposed, and the polysilicon layer 23 is dry-etched using the resist mask. With this operation, in the region in which the element region is formed, all the polysilicon layer 23 on the surface of the single-crystalline silicon substrate 10 is etched, and then a gate electrode 16 embedded in the trench 14 is formed. At the same time, on the oxide film 31 located on a corner of the chip, a polysilicon layer 23a, a circular polysilicon layer 23b, and a connection part 23c (not shown in this drawing) which are included in the protection diode 2 are formed (FIG. 10C).

Fourth step (FIGS. 11A, 11B, 12A, and 12B): A new resist film is provided so as to form a resist mask PR which allows the source region and a region in the protection diode in which the n+ type impurity region is formed to be exposed. Thereafter, arsenic (As), for example, is introduced thereto by ion implantation. As the implantation conditions, a dose amount is set in an approximate range from $5.0 \times 10^{15}$ cm$^{-2}$ to $6.0 \times 10^{15}$ cm$^{-2}$, and an implantation energy is set at 140 KeV (FIG. 11A).

The resist mask is removed, and a new resist film is provided to form a resist mask PR which allows a body region and the surface of the guard ring 32 to be exposed. The surface of the single-crystalline silicon substrate 10 exposed from the resist mask PR is slightly etched, and then boron, for example, is introduced by ion implantation. As the implantation conditions, a dose amount is set in an approximate range from $2.0 \times 10^{15}$ cm$^{-2}$ to $5.0 \times 10^{15}$ cm$^{-2}$, and an implantation energy is set at 40 KeV (FIG. 11B).

After the removal of the resist mask PR, a new CVD oxide film (for example, a boron phospho silicate glass (BPSG) film) 19' is deposited on the entire surface. Upper part of the channel layer 13 is also covered by the BPSG film (insulating film) 19'. Although the region in which the protection diode is formed is also covered by the BPSG film 19', any insulating film other than one located above the channel layer 13 will be collectively referred to as an insulating film 31 in the following steps (FIG. 12A).

Thereafter, the BPSG film 19' is flowed (900° C.). As a result, the implanted arsenic and boron are diffused, and then an n+ type source region 17 is formed on the surface of the channel layer 13 adjacent to the trench 14.

Meanwhile, a body region 18 is formed on the surface of the channel layer 13 located between the source regions 17, and a contact part 32a is formed on the surface of the guard ring 32. Then, an element region 5 is formed in which a vertical MOSFET 6 consisted of a large number of cells is arranged.

At the same time, a first n+ type impurity region 22a and a second n+ type impurity region 22b are formed keeping a predetermined distance from each other on the surface of the p− type impurity region 21 formed in a circular pattern. The first n+ type impurity region 22a and the second n+ type impurity region 22b are formed in the same step and under the same conditions as those for the source region 17.

Furthermore, these regions are formed in a pattern concentric with the p− type impurity region 21. With this operation, a protection diode 2 (unit protection diode 2a) is formed (FIG. 12B).

Note that the order of impurity implantations for the body region 14 and the source region 15 may be switched in this step.

Fifth step (FIG. 13): On the insulating films 19' and 31, a resist mask PR which allows a desired contact hole to be exposed is provided. Then, the insulating films 19' and 31 are etched.

With this operation, an interlayer insulating film 19 covering at least the gate electrode 16 of the MOSFET 6 is formed. At the same time, a contact hole CH is formed in which the source region 17 and the body region 18 are exposed.

Meanwhile, a contact hole CH is formed in which the first n+ type impurity region 22a, the second n+ type impurity region 22b, and the polysilicon layer 23a of the protection diode 2 are exposed.

Thereafter, the resist mask PR is removed, aluminum or the like is spattered on the entire surface, and a metal wiring layer 7 on which a source electrode 7s and a gate pad electrode 7g are patterned is formed. The source electrode 7s covers the entire surface of the element region 5 and the first n+ type impurity region 22a located at the outermost circle of the protection diode 2, and is in contact with the source region 17, the body region 18, and the first n+ type impurity region 22a. Meanwhile, the gate pad electrode 7g covers the polysilicon layer 23a of the protection diode 2 and the second n+ type impurity region 22b located at the innermost circle of the protection diode 2, and is in contact with them. With this operation, a final structure shown in FIG. 3A is obtained.

Note that, in the case where a protection diode 2 in a multi-circular pattern is to be formed, in the first step and the fourth step, the p− type impurity region 21 and the first and second n+ type impurity regions 21b and 22b respectively, may be formed in a multi-ring concentric pattern.

Then, in the fifth step, a source wiring 7w for selecting any number of unit protection diodes 2a according to a desired breakdown voltage may be patterned. The source wiring 7w connects the first n+ type impurity region 22a and the second n+ type impurity region 22b of two adjacent unit protection diodes 2a, respectively.

A breakdown voltage of a diode can be added. Accordingly, since the breakdown voltage of the npn junction formed in the above process is approximately 5 V, breakdown voltages of approximately 10 V, 15 V, and 20 V can be obtained with 2, 3, and 4 diodes, respectively.

As described above, according to the present embodiment, the protection diode 2 having a single-crystalline pn junction can be formed by use of a manufacturing process of the MOSFET 6. In other words, compared to the conventional case where a protection diode is formed by a multi-crystalline polysilicon layer, simplification of the manufacturing process and reduction in cost can be achieved because a step of forming only a protection diode is not necessary to be installed in the manufacturing process.

Furthermore, the manufacturing process can be carried out without changing the current conditions of processing a MOSFET. Accordingly, current characteristics of a MOSFET are not deteriorated.

Moreover, since the protection diode 2 is formed by diffusing an impurity into the single-crystalline silicon substrate, good characteristics as a constant voltage diode can be obtained.

Generally, deterioration in performance tends to occur due to process streamlining and cost reduction. However, according to the present embodiment, it is possible to improve the performance of a protection diode and the performance of a MOSFET, and also to achieve a simplified process and cost reduction.

Furthermore, by selecting the number of unit protection diodes to be connected according to breakdown voltage, it is easy to control the breakdown voltage.

Note that, although the n-channel type MOSFET having a trench structure has been described as an example of a MOS transistor, a p channel type MOSFET of an opposite conductivity type can also be applied in a similar manner. In such a case, a protection diode has a configuration in which two p+ type impurity regions 22a and 22b are diffused in an n– type impurity region 21 formed in a circular pattern, and a pnp junction is formed.

Meanwhile, in addition to a MOSFET having a trench structure, a vertical MOSFET, in which the gate electrode 16 is arranged on the surface of the single-crystalline silicon substrate 10 with the gate oxide film 15 interposed therebetween, having a planer structure can also be applied.

Furthermore, an IGBT in which a p type semiconductor layer is provided below the n+ type silicon semiconductor substrate 11 may also be applied.

According to the present invention, the following effects can be obtained.

Firstly, a single-crystalline Zener diode in which a pn junction (an npn junction or a pnp junction) is formed by diffusing an impurity into a silicon substrate is used as a protection diode. Since the single-crystalline pn junction has steep I-V characteristics, ideal constant voltage characteristics as breakdown characteristics can be obtained. Accordingly, even if a large excessive load is externally applied, an excessive current can be sufficiently bypassed by use of the protection diode. As a result, no voltage equal to or above the breakdown voltage of the protection diode is applied to a gate electrode of a MOSFET. Thus, breakdown of a gate oxide film can be prevented.

Secondly, since almost no leakage current occurs before breakdown, the switching characteristics of the MOSFET are not adversely affected.

Thirdly, the protection diode can be entirely formed during a manufacturing process of the MOSFET. Accordingly, an additional step of forming the protection diode is not required, and a masking step and a doping step or an etching step, which are involved in the step of forming a protection diode, can be omitted. Therefore, the process can be largely shortened. In addition, no change in processing conditions of the MOSFET is required. In other words, according to the present embodiment, no deterioration is likely in performance due to process streamlining or cost reduction, and the process can be simplified and cost reduction can be achieved while the performance of the protection diode is improved.

Fourthly, since the protection diode can provide sufficient protection against an excessive current, it is not necessary to make the gate oxide film thicker than necessary for an applied voltage. Accordingly, it is possible to eliminate or largely reduce a margin for breakdown voltage of the gate oxide film, and to bring out the maximum device performance of the MOSFET.

Fifthly, multiple npn junctions (pnp junctions) are formed by arranging the multiple protection diodes in circular patterns, and any number of npn junctions to be connected can be selected by using a pattern of appropriate contact holes and metal wirings according to breakdown voltage. Accordingly, it is easy to control the breakdown voltage of the protection diodes.

What is claimed is:

1. A semiconductor device comprising:
a vertical metal oxide semiconductor transistor formed in a single-crystalline semiconductor substrate of a first general conductivity type and comprising a gate electrode and a source electrode; and
a protection element comprising a first impurity region of a second general conductivity type formed in the single-crystalline semiconductor substrate, a second impurity region of the first general conductivity type formed in the first impurity region and a third impurity region of the first general conductivity type formed in the first impurity region and separated away from the second impurity region, the first, second and third impurity regions being concentric,
wherein the second impurity region is connected to the gate of the transistor, and the third impurity region is disposed outside the second impurity region and connected to the source of the transistor.

2. The semiconductor device of claim 1, wherein the first, second and third impurity regions are circular.

3. The semiconductor device of claim 2, wherein the first circular impurity region comprises a plurality of circular and concentric sub-regions of the second general conductivity type separated from each other, the second circular impurity region is disposed in the most inner sub-region, the third circular impurity region is disposed in the most outer sub-region, and a portion of the protection element comprising the most inner sub-region and a portion of the protection element comprising the most outer sub-region are connected in series.

4. The semiconductor device according to claim 2, wherein the first circular impurity region has an impurity concentration of a channel layer of the transistor.

5. The semiconductor device of claim 2, further comprising an insulating film formed on the single-crystalline semiconductor substrate so as to cover a region of the substrate in which the first, second and third circular impurity regions are formed, and a conductor layer formed on the insulating film and connected to the gate electrode.

6. A method of manufacturing a semiconductor device comprising a vertical metal oxide semiconductor transistor and a protection element for the transistor, comprising:
providing a single-crystalline semiconductor substrate of a first general conductivity type;
forming a impurity region of a second general conductivity type in the single-crystalline semiconductor substrate;
forming two impurity regions of the first general conductivity type in the impurity region of the second general conductivity type so as to be concentric with the impurity region of the second general conductivity type;
connecting one of the two impurity regions of the first general conductivity type to a gate of the transistor; and
connecting another of the two impurity regions of the first general conductivity type to a source of the transistor.

7. The method of claim 6, wherein the impurity region of the second general conductivity type and the two impurity regions of the first general conductivity type are circular.

8. A method of manufacturing a semiconductor device, comprising:
providing a single-crystalline semiconductor substrate of a first general conductivity type;
forming a channel layer of a second general conductivity type in the substrate;
forming a circular impurity region of the second general conductivity type in the substrate;
forming a gate electrode in contact with the channel layer with an insulating layer interposed therebetween;
forming a source region of the first general conductivity type in the channel layer adjacent the gate electrode;
forming two circular impurity regions of the first general conductivity type in the circular impurity region of the second general conductivity type so as to be concentric with the circular impurity region of the second general conductivity type;
forming a source electrode so as to be connected to the source region and one of the two circular impurity regions of the first general conductivity type; and
forming a gate pad electrode so as to be connected to the gate electrode and another of the two circular impurity regions of the first general conductivity type.

9. A method of manufacturing a semiconductor device, comprising:

provinding a single-crystalline semiconductor substrate of a first general conductivity type;

forming a channel layer of a second general conductivity type in the substrate;

forming a circular impurity region of the second general conductivity type in the substrate;

forming a trench penetrating the channel layer and reaching the semiconductor substrate;

covering an inner wall of the trench with an insulating film;

forming a gate electrode in the trench covered with the insulating film;

forming a source region of the first general conductivity type in the channel layer adjacent the trench;

forming a first circular impurity region of the first general conductivity type in the circular impurity region of the second general conductivity type so as to be concentric with the circular impurity region of the second general conductivity type;

forming a second circular impurity region of the first general conductivity type in the circular impurity region of the second general conductivity type so as to be concentric with the circular impurity region of the second general conductivity type and to be disposed outside the first circular impurity region of the first general conductivity type;

forming a gate pad electrode so as to be connected to the gate electrode and the first circular impurity region of the first general conductivity type; and forming a source electrode so as to be connected to the source region and the second circular impurity region of the first general conductivity type.

10. The method of claim 8, wherein the channel layer and the circular impurity region of the second general conductivity type are formed in the substrate in the same process step.

11. The method of claim 9, wherein the channel layer and the circular impurity region of the second general conductivity type are formed in the substrate in the same process step.

12. The method of claim 8, wherein the source region and the two circular impurity regions of the first general conductivity type are formed in the same process step.

13. The method of claim 9, wherein the source region and the first and second circular impurity regions of the first general conductivity type are formed in the same process step.

14. The method of claim 9, wherein the formation of the circular impurity region comprises forming a plurality of circular and concentric sub-regions of the second general conductivity type separated from each other, the first circular impurity region is formed in the most inner sub-region, and the second circular impurity region is formed in the most outer sub-region.

* * * * *